(12) United States Patent
Noichi

(10) Patent No.: US 7,440,330 B2
(45) Date of Patent: Oct. 21, 2008

(54) SEMICONDUCTOR MEMORY DEVICE

(75) Inventor: Shuhei Noichi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 11/636,494

(22) Filed: Dec. 11, 2006

(65) Prior Publication Data

US 2007/0133319 A1    Jun. 14, 2007

(30) Foreign Application Priority Data

Dec. 12, 2005  (JP) ............... 2005-357962

(51) Int. Cl.
  *G11C 11/34* (2006.01)
(52) U.S. Cl. ............... 365/185.2; 365/189.09
(58) Field of Classification Search ............... 365/185.2, 365/189.09
  See application file for complete search history.

(56) References Cited

U.S. PATENT DOCUMENTS 5,793,674 A    8/1998    Kubo et al.

2002/0027233 A1    3/2002    Yamaki et al.
2002/0048191 A1    4/2002    Ikehashi et al.
2002/0176281 A1*   11/2002   Tang ............... 365/185.22
2004/0008543 A1*   1/2004    Kato ............... 365/189.01
2005/0201171 A1*   9/2005    Choi et al. ............... 365/205

FOREIGN PATENT DOCUMENTS

JP    2003-178597    6/2003

* cited by examiner

*Primary Examiner*—Hoai V. Ho
*Assistant Examiner*—Anthan T Tran
(74) *Attorney, Agent, or Firm*—McDermott Will & Emery LLP

(57) ABSTRACT

A reference cell outputs a reference current of a data reading current of a memory cell. A trimming data in accordance with the reference current is memorized in a non-volatile memory cell. A standard current generator outputs a standard current whose current quantity is adjusted in accordance with the trimming data. A current comparator compares the standard current to the reference current. The output of the reference current from the reference cell is adjusted through a reference cell adjuster based on a result of the comparison by the current comparator.

9 Claims, 12 Drawing Sheets

F I G. 1
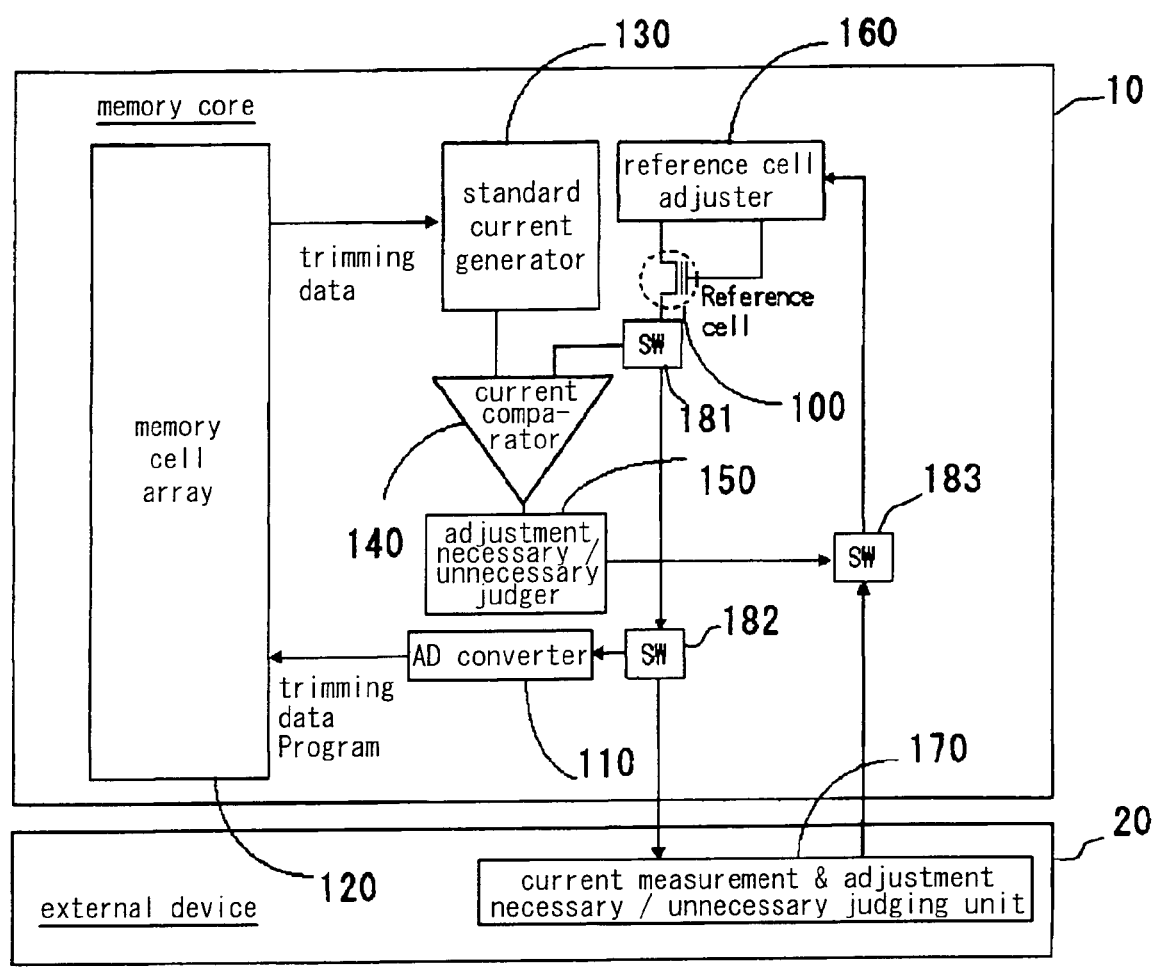

F I G. 2
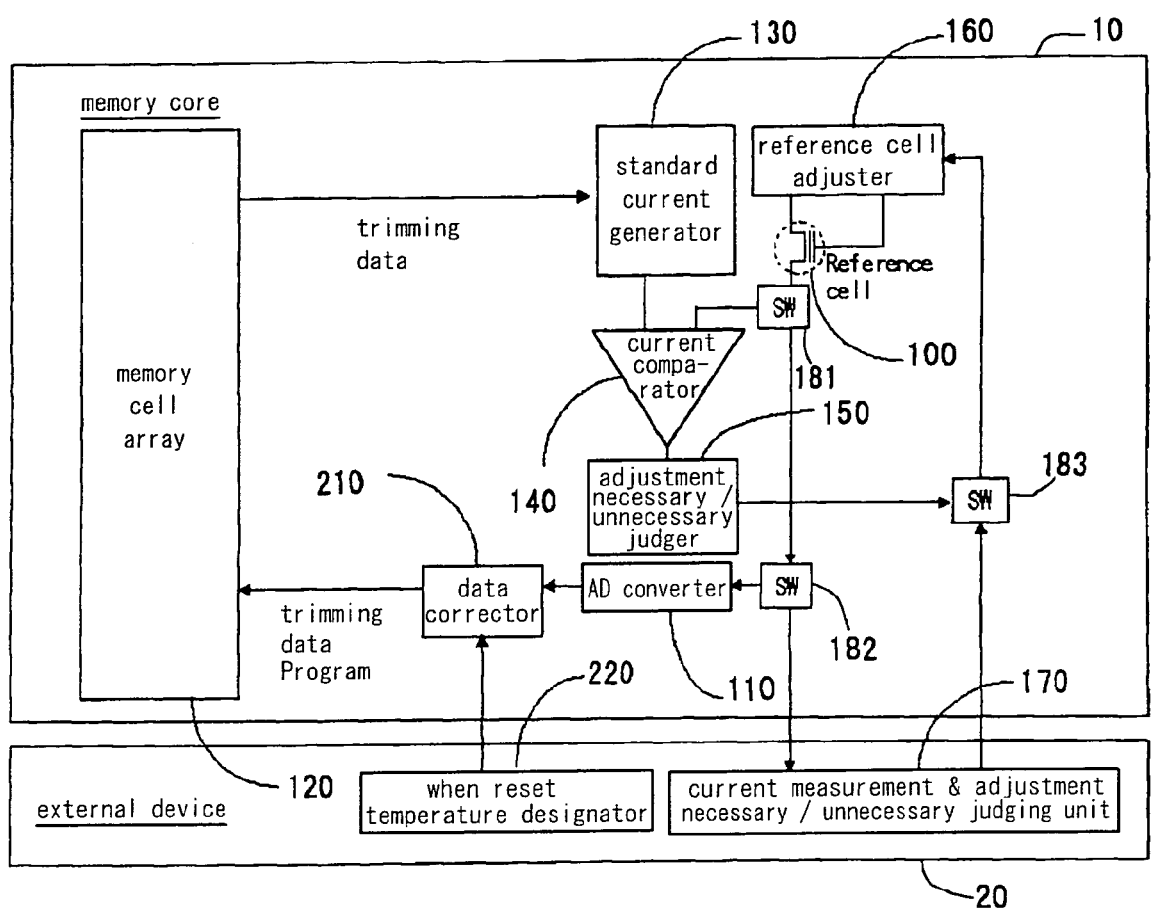

F I G. 3
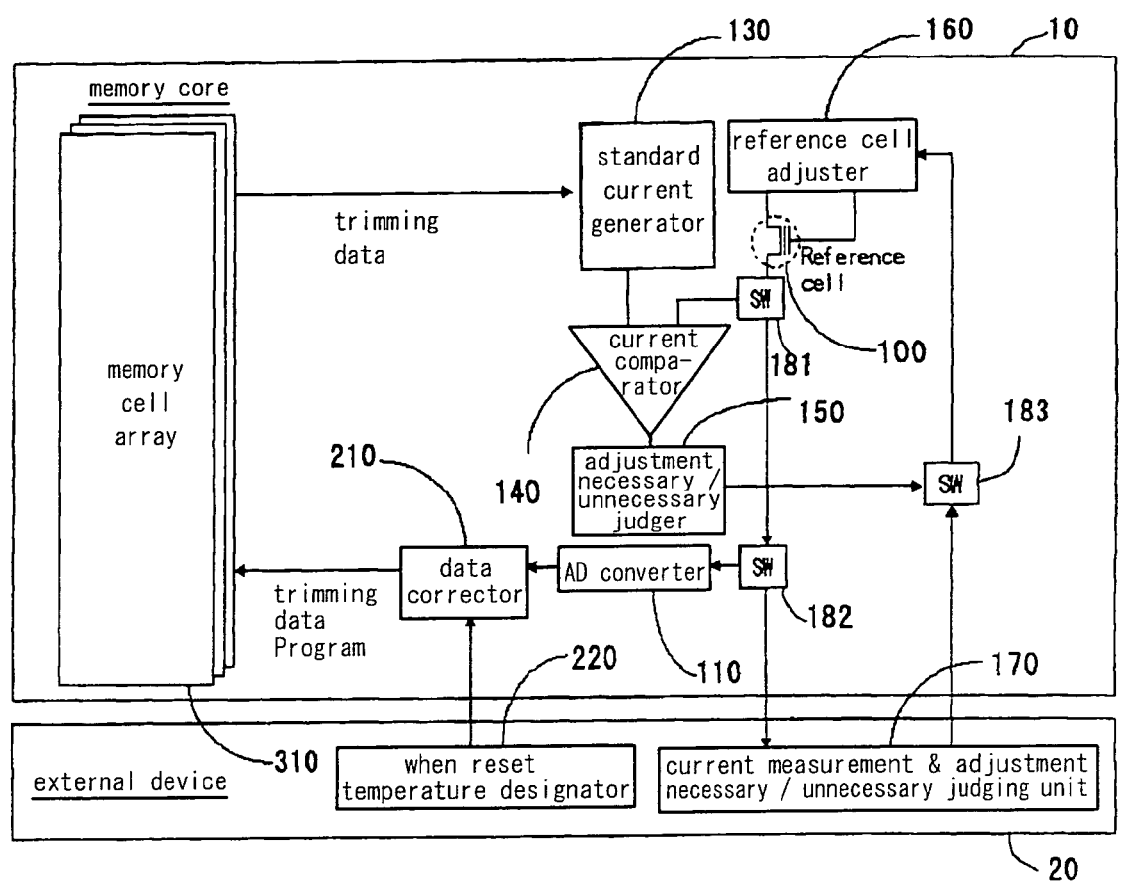

F I G. 4
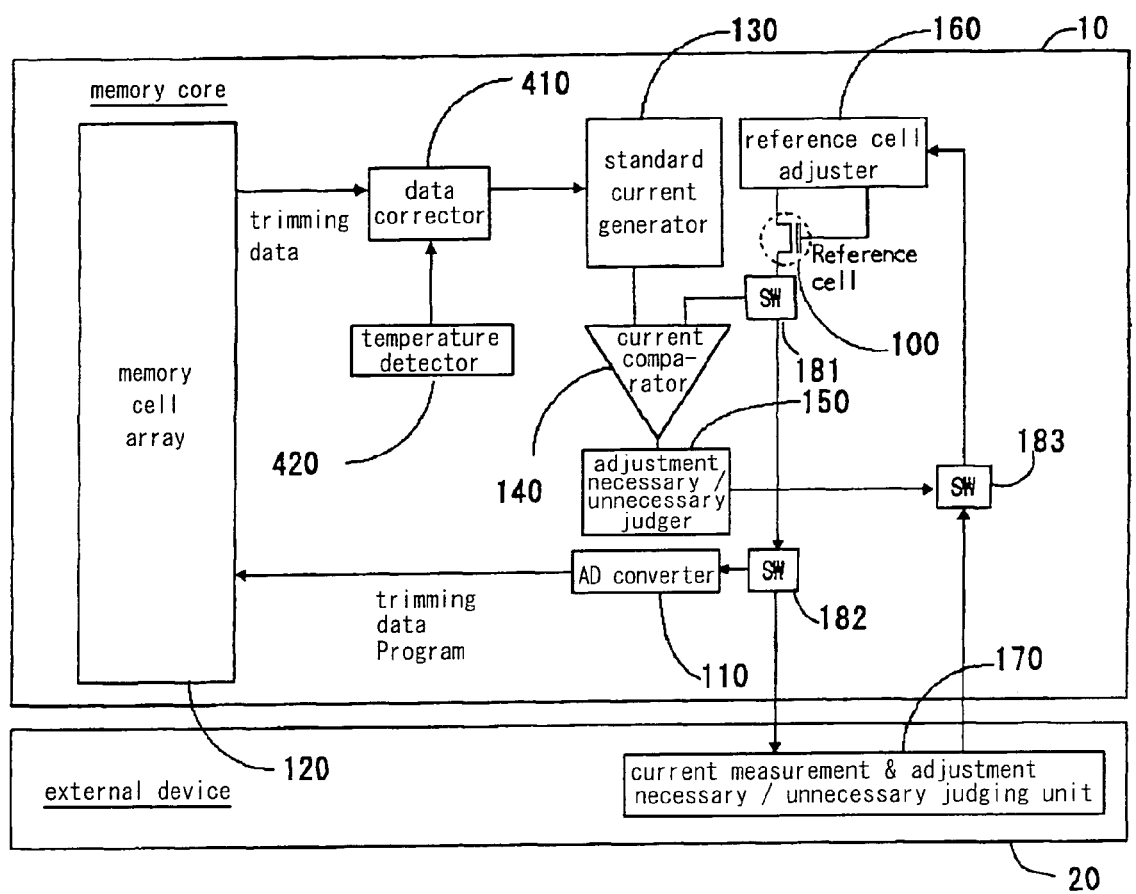

F I G. 6
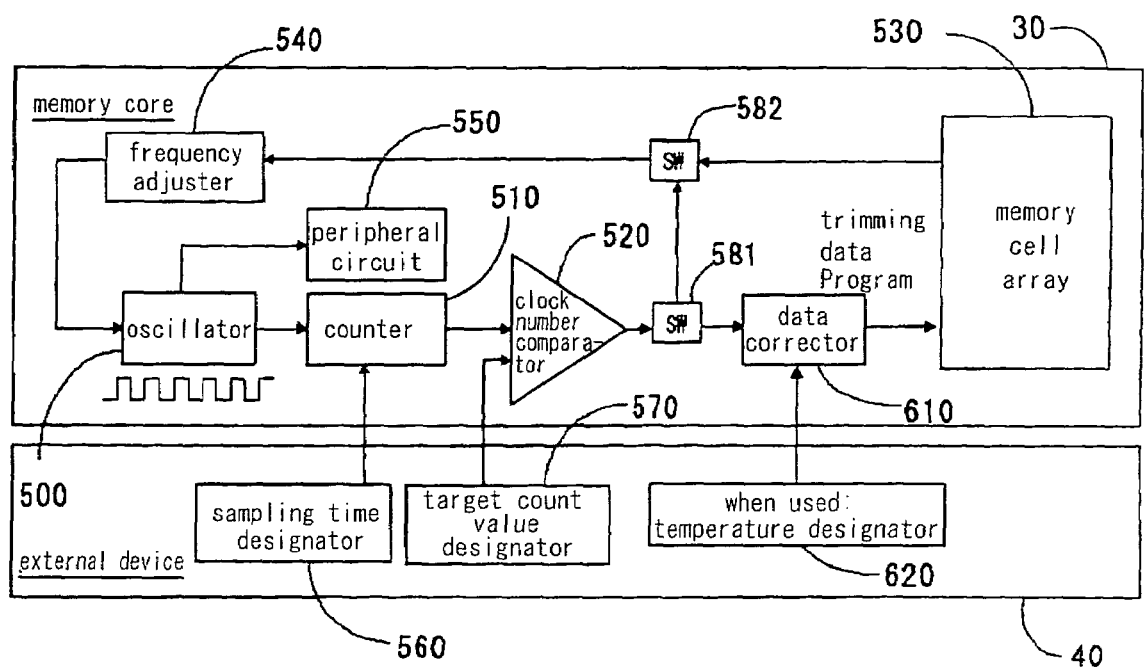

F I G. 8
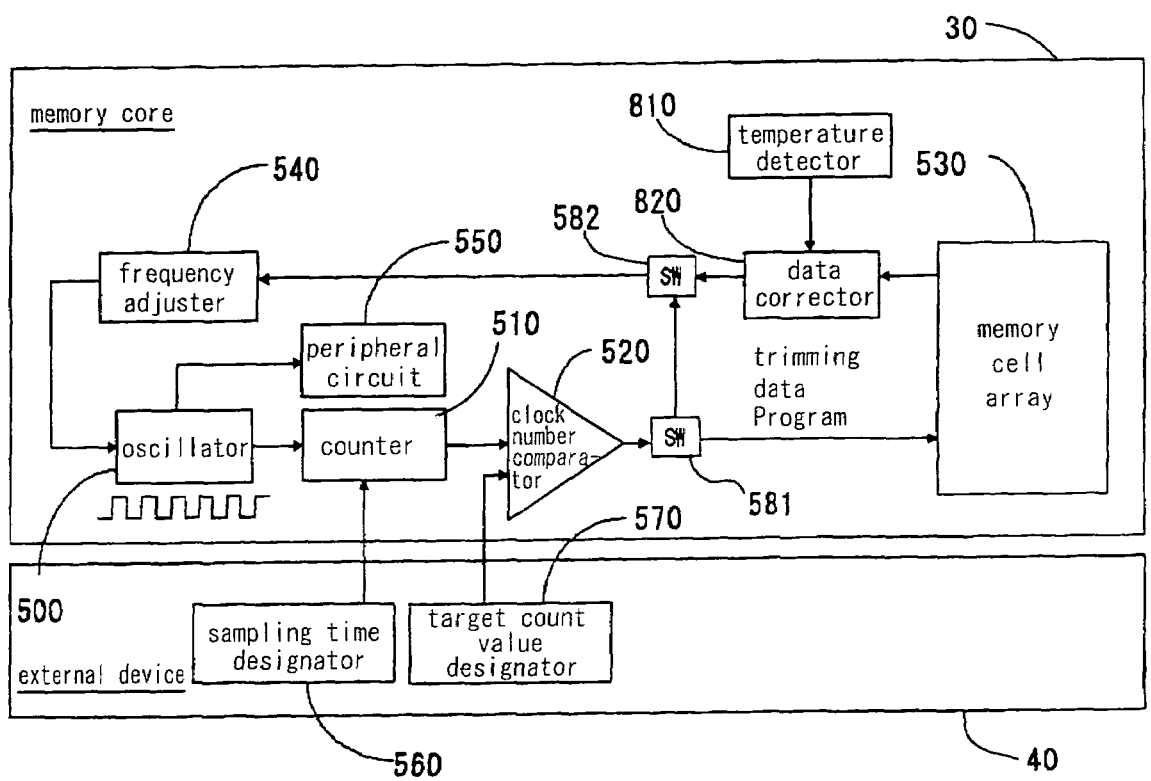

F I G. 1 0
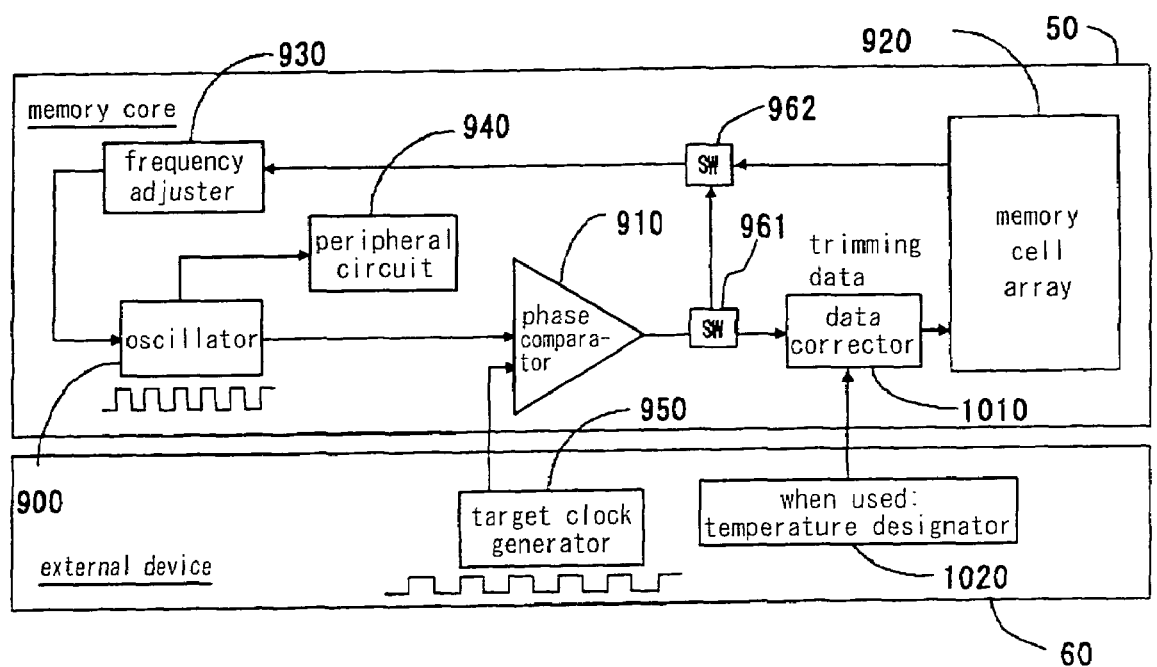

F I G. 1 2
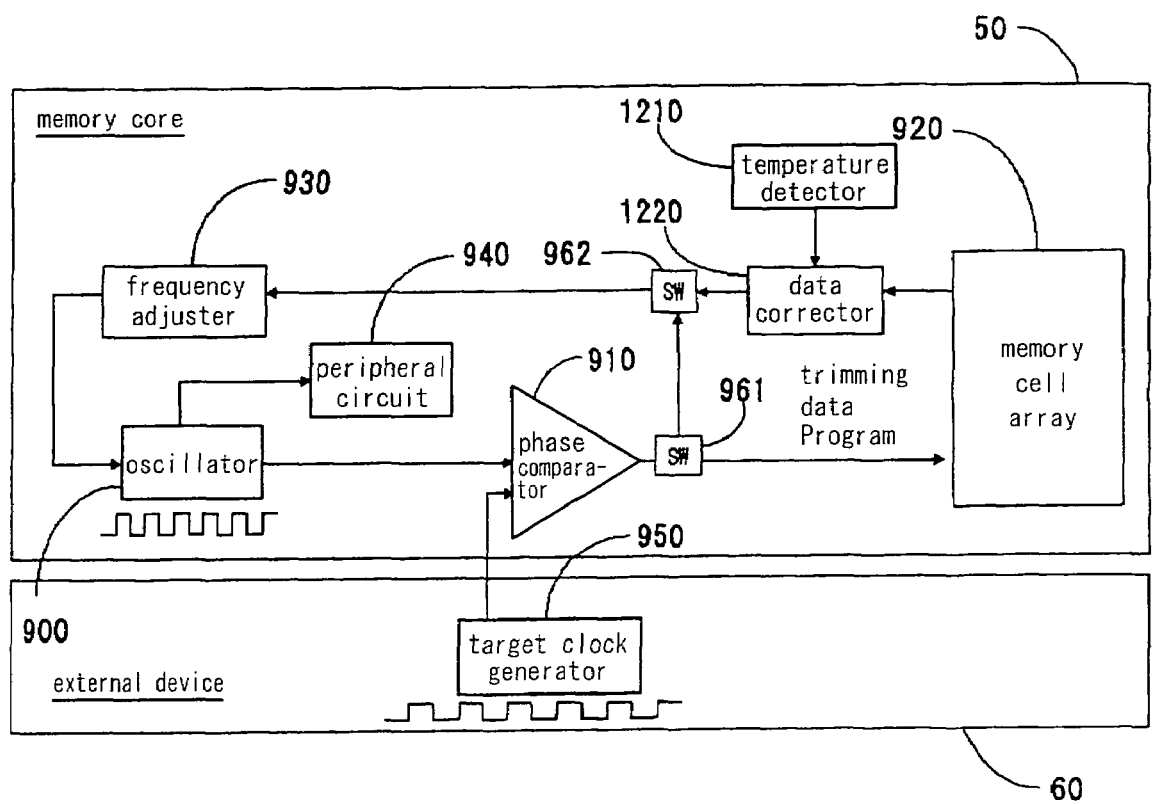

SEMICONDUCTOR MEMORY DEVICE

BACKGROUND OF THE INVENTION

1. Field of the Invention

The present invention relates to a semiconductor memory device comprising a current corrector and a frequency corrector.

2. Description of the Related Art

In a frequency trimming processing in conventional voltage/current/oscillator circuits and the like, an external device (for example, LSI tester) is used to measure a voltage, a current and a frequency, and trimming (optimizing) data for correcting a result of the measurement to a value as close as possible to a targeted value is calculated, and the trimming data is programmed in a non-volatile memory.

For example, when a semiconductor memory device is manufactured, there are variations in parameters, such as a thickness of a gate oxide film, dimensions of respective parts, an impurity concentration in a diffusion region and the like, in each manufacturing process. Accordingly, there are variations in a standard voltage for setting optimum writing, reading and erasing potentials and other voltages. Such variations in the manufacturing process make an actual state of the semiconductor device different from a state of the semiconductor memory device originally expected in a designing process. In order to absorb the variations in the manufacturing process of the semiconductor memory device, the trimming processing is executed in the semiconductor memory device so that the before-mentioned voltages can be optimized.

In the trimming processing like this, for example, with respect to trimming of the voltage, such a method has been proposed wherein it is unnecessary to provide any special examination and device for storing a trimming value become unnecessary by monitoring a voltage generated in the LSI in an AD converter so that the trimming data is constantly generated was proposed.

However, the trimming data in the trimming method in which the conventional external device is used is specific random data with respect to each chip. Therefore, in the case where a plurality of chips is simultaneously measured by the external device, it becomes necessary to individually control each chip when measurement/calculation/program read from the non-volatile memory is executed.

Further, according to the method proposed in the foregoing patent document, as the correction is necessarily executed every time when the chip is operated after the correction based on the trimming data, an additional current is consumed correspondingly. Further, a resolving power in the correction is constant, and it is not possible to flexibly select an amount of time and resolving power demanded in the correction.

SUMMARY OF THE INVENTION

Therefore, a main object of the present invention is to provide a semiconductor memory device capable of executing a trimming process inside a chip without incurring increase of power consumption and deterioration of a trimming accuracy In order to achieve the foregoing object, a semiconductor memory device according to the present invention comprises:

a memory cell;

a reference cell for outputting a reference current of a data reading current of the memory cell;

a non-volatile memory cell for memorizing a trimming data in accordance with the reference current;

a standard current generator for outputting a standard current in a state where a current volume is adjusted in accordance with the trimming data;

a current comparator for comparing the standard current to the reference current; and a reference cell adjuster for adjusting an output of the reference current from the reference cell based on a result of the comparison by the current comparator.

According to the foregoing constitution, the current trimming value can be calculated inside the chip and memorized in the non-volatile memory cell, and the trimming data is retrieved from the non-volatile memory cell so as to adjust the reference current only for resetting the reference cell in the case where the reference cell deteriorated due to a thermal stress or the like. As a result, the reference cell can be restored to the state before the deterioration.

A semiconductor memory device according to the present invention comprises:

an oscillator;

a clock comparator for comparing a clock outputted from the oscillator to a reference clock;

a non-volatile memory cell for memorizing a result of the comparison by the clock comparator as a trimming data; and a frequency adjuster for adjusting a clock frequency of the oscillator in accordance with the trimming data.

According to the foregoing constitution, the trimming data can be calculated at a high speed inside the chip and memorized it in the non-volatile memory cell, and thereafter, the clock frequency generated by the oscillator can be kept constantly at a certain value based on the trimming data memorized in the non-volatile memory cell. Further, an amount of time for counting a clock number and a trimming resolving power can be selected in accordance with an accuracy required for trimming the frequency.

In addition, it is possible to be constituted in a manner where the semiconductor memory device according to the present invention further comprises a data corrector for correcting the trimming data in accordance with temperature characteristics of the standard current, reference current and oscillator. As a result, the accurate trimming can be carried out even in the case where the temperatures are different at the time of calculating the trimming data, resetting the reference cell or using the oscillator.

According to the semiconductor memory device of the present invention as described above, measurement/calculation/programming treatment in the non-volatile memory with respect to the random trimming data specific to each chip are carried out inside the chip. As a result, it becomes unnecessary to individually control each chip even in the case where a plurality of chips is simultaneously measured by the external device.

The trimming correction is only demanded when the reference cell is reset and becomes unnecessary in the chip operation thereafter. As a result, the current consumption can be reduced while the trimming process inside the chip being realized.

Further, the amount of time and the resolving power demanded in the correction can be flexibly selected. As a result, the trimming processing, while it is realized inside the chip, can be achieved with a higher accuracy.

Even in the case where it is necessary to execute the trimming at higher frequency and with high accuracy in the trimming processing, the frequency trimming value can be more speedily calculated and the high speed operation/a testing time reduction can be realized.

Further, according to the present invention, the function of correcting the temperature characteristics is provided inside the chip. Therefore, the same effect as the case where there is no temperature change can be achieved under various temperature conditions in testing processes and actual usage.

The semiconductor memory device according to the present invention is effectively applicable as a semiconductor memory device which has a self-current trimming function, a self frequency trimming function and a temperature correcting function inside the chip, and can realize a trimming processing with a higher efficiency and accuracy.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 1 is a block diagram of a semiconductor memory device according to a preferred embodiment 1 of the present invention.

FIG. 2 is a block diagram of a semiconductor memory device according to a preferred embodiment 2 of the present invention.

FIG. 3 is a block diagram of a semiconductor memory device according to a preferred embodiment 3 of the present invention.

FIG. 4 is a block diagram of a semiconductor memory device according to a preferred embodiment 4 of the present invention.

FIG. 6 is a block diagram of a semiconductor memory device according to a preferred embodiment 6 of the present invention.

FIG. 8 is a block diagram of a semiconductor memory device according to a preferred embodiment 8 of the present invention.

FIG. 10 is a block diagram of a semiconductor memory device according to a preferred embodiment 10 of the present invention.

FIG. 12 is a block diagram of a semiconductor memory device according to a preferred embodiment 12 of the present invention.

DETAILED DESCRIPTION OF THE INVENTION

Figure 5:
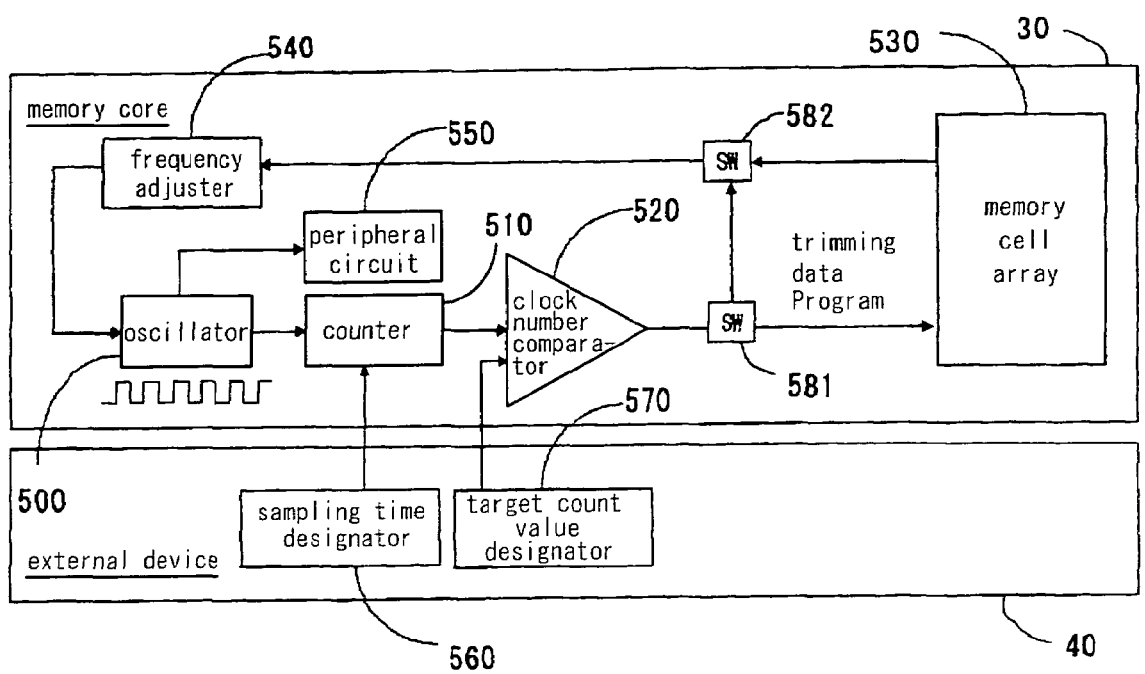
FIG. 5 is a block diagram of a semiconductor memory device according to a preferred embodiment 5 of the present invention.

Hereinafter, preferred embodiments of the present invention are described referring to the drawings.

Preferred Embodiment 1

FIG. 1 is a block diagram of a semiconductor memory device according to a preferred embodiment 1 of the present invention. In FIG. 1, a reference numeral 100 denotes a reference cell for outputting a reference current of a data reading current of a memory cell. The reference cell 100 has a structure equal to the memory cell and thereby outputs the reference current. 110 denotes an AD converter for converting a current quantity of the reference cell 100 into a digital value. 120 denotes a non-volatile memory cell array comprising a trimming data region other than a region used by a user and memorizing the AD-conversion value of the current quantity in the reference cell 100 as a trimming data. 120 denote of the reference cell 100 in the trimming data region as a trimming data. 130 denotes a standard current generator for generating a standard current in which the current quantity is adjusted in accordance with the trimming data memorized in the non-volatile memory cell array 120. 140 denotes a current comparator for comparing the standard current to the reference current of the reference cell 100. 150 denotes an adjustment necessary/unnecessary judger for judging whether or not the adjustment of the reference cell 100 is necessary based on a result of the comparison by the current comparator 140. 160 denotes a reference cell adjuster for adjusting the reference cell 100 based on a result of the judgment by the adjustment necessary/unnecessary judger 150 or an external input signal from an external device 20. These components 100-160 are provided in a memory core 10 that is a chip. 170 denotes a current measurement & adjustment necessary/unnecessary judger provided in the external device 20, the current measurement & adjustment necessary/unnecessary judging unit for measuring the reference current of the reference cell 100 and judging whether or not the adjustment is necessary based on the measurement.

The reference current of the reference cell 100 is transmitted to the current comparator 140 or a switch 181 by switching over with the switch 181. The reference current of the reference cell 100 is transmitted to the AD converter 110 or the current measurement & adjustment necessary/unnecessary judging unit 170 by switching over with the switch 181. A switch 183 transmits the adjustment necessary instruction from the adjustment necessary/unnecessary judger 150 or the adjustment necessary instruction from the current measurement & adjustment necessary/unnecessary judger 170 respectively to the reference cell adjuster 160.

An operation of the semiconductor memory device with the aforementioned constitution according to the preferred embodiment 1 is described below.

Setting of Trimming Data

First, in order to set a Vt (threshold) level of the reference cell 100 to a predetermined level, the current of the reference cell 100 is measured in the current measurement & adjustment necessary/unnecessary judging unit 170 of the external device 20 (for example, LSI tester). The foregoing predetermined level is such a level that data of the memory cell can be judged to be "1" or "0" and an intermediate value between the Vt level of the "1" data and the Vt level of the "0" data is set.

The current measurement & adjustment necessary/unnecessary judger 170 judges whether or not the adjustment in relation to the reference cell 100 is necessary in accordance with the current measurement result of the reference cell 100. Further, the current measurement & adjustment necessary/unnecessary judger 170 executes no processing with respect to the memory core 10 when the adjustment is judged to be unnecessary, and outputs the adjustment instruction to the reference cell adjuster 160 when the adjustment is judged to be necessary.

When it is judged that the Vt level of the reference cell 100 fails to reach the predetermined level, the reference cell adjuster 160 executes the adjustment to increase the Vt level to the reference cell 100 based on the adjustment instruction supplied from the current measurement & adjustment necessary/unnecessary judger 170.

When the Vt level of the reference cell 100 is judged to have reached the predetermined level, the AD converter 110 digital-converts an amount of the reference current of the reference cell 100 and supplies the digital value thereby obtained to the memory cell array 120 as the trimming data. The memory cell array 120 memorizes the supplied trimming data. The judgment whether or not the Vt level of the reference cell 100 has reached the predetermined level is made by the external device 20 such as the LSI tester or the like based on comparison to an expected value memorized in a an external device 20 or a microcode.

Setting of Trimming Data

In the case where the Vt level of the reference cell 100 is deteriorated by a thermal stress or the like, it is necessary to reset the Vt level. An operation in resetting the Vt level is described below. The standard current of the standard current generator 130 is adjusted based on the trimming data stored in the memory cell array 120, and the amount of the reference cell of the reference cell 100 in the state where the Vt level is deteriorated is compared to the adjusted standard current amount in the current comparator 140.

In accordance with a result of the comparison described above, the adjustment necessary/unnecessary judger 150 judges whether or not it is necessary to adjust the reference cell 100. When the adjustment necessary/unnecessary judger 150 judges that the Vt level of the reference cell 100 fails to reach the predetermined level, the reference cell adjuster 160 adjusts the Vt level memorized in the reference cell 100 so as to increase it based on the judgment result.

Thereafter, until the Vt level of the reference cell 100 reaches the predetermined level, the current comparison by the current comparator 140, the judgment on the necessity of the adjustment by the adjustment necessary/unnecessary judger 150 and the adjustment by the reference cell adjuster 160 are repeated.

According to the semiconductor memory device thus constituted, the current trimming value can be calculated inside the chip and memorized in the memory cell array 120. Then, the trimming data is retrieved from the memory cell array 120 only for resetting in the case where the Vt level of the reference cell 100 is deteriorated due to the thermal stress or the like so as to adjust the amount of the standard current that is the reference basis for comparison of the reference cell 100. As a result, the Vt level of the reference cell 100 can be restored to a level before the deterioration.

Further, as processing such as measurement, calculation and programming in the non-volatile memory can be carried out inside the chip, it is unnecessary for the external device 20 to individually control each chip even when more than one chip is simultaneously measured by the external device 20. As a result, testing costs including a testing time, number of steps for developing a test program and the like can be cut down, and any human error resulting from the complication of the test program can be reduced.

Further, the trimming correction may be performed only when the reference cell 100 is reset and becomes unnecessary in any subsequent chip operation. As a result, the current consumption can be reduced while the trimming processing inside the chip is realized at the same time.

Preferred Embodiment 2

FIG. 2 is a block diagram of a semiconductor memory device according to a preferred embodiment 2 of the present invention. Any like component is provided with the same reference numeral as shown in FIG. 1 and is not described again. In FIG. 2, 210 denotes a data corrector provided in the memory core 100 and correcting the trimming data based on a designated temperature inputted from outside. 220 denotes a temperature designator provided in the external device 20 and designating a ambient temperature when the reference cell 100 is reset.

An operation of the semiconductor memory device according to the preferred embodiment 2 thus constituted is described below. The operation according to the preferred embodiment 2 is basically similar to that of the preferred embodiment 1. The preferred embodiment 2 is different from the preferred embodiment 1 in that the amount of the reference current of the reference cell 100 is digitally converted in the AD converter 110 and the trimming data consisting of the digital-value obtained is corrected in the data corrector 210 in accordance with the designated temperature inputted from the temperature designator 220.

The designated temperature inputted from the temperature designator 220 is a current ambient temperature designated in each of a plurality of temperature ranges such as a high-temperature range, an ordinary-temperature range and a low-temperature range when the test is performed in the plurality of temperature ranges in the test process. More specifically, the trimming data is memorized in the memory cell array 120 as described in the preferred embodiment 1, and it is assumed that the trimming data is the trimming data set in the manufacturing process in the ordinary-temperature range. In the case where the current temperature in executing the test process is in the normal-temperature range, the set temperature range and the ambient temperature when the test is performed are equal to each other. Therefore, the trimming data memorized in the memory cell array 120 is directly used to reset the Vt level in the case where the Vt level of the reference cell 100 between the manufacturing process and the test process is deteriorated. The trimming data is reset according to the method described in the preferred embodiment 1.

However, when the current ambient temperature in the test process is in the high-temperature range in the case where the trimming data shows the value set in the manufacturing process in the ordinary-temperature range, the deterioration of the Vt level of the reference cell 100 due to the thermal stress in the foregoing state is larger than the deterioration in the ordinary-temperature range. When the deterioration of the Vt level in the high-temperature range is hypothetically larger by "1" than the deterioration of the Vt level in the ordinary-temperature range, the trimming data memorized in the memory cell array 120 is corrected so as to increase by +1 in the data corrector 210. Accordingly, the Vt level is reset based on the trimming data increased by +1 in the high-temperature range where the deterioration is larger by "1". As a result, even in the case where the ambient temperature when the test process is performed is in the high-temperature range, the Vt level prior to the deterioration can be accurately restored in a manner similar to the case of the ordinarily-temperature range.

On the contrary to the foregoing case, when the current ambient temperature in the test process is in the low-temperature range in the case where the trimming data shows the value set in the manufacturing process in the ordinary-temperature range, the deterioration of the Vt level of the reference cell 100 due to the thermal stress in the foregoing state is smaller than the deterioration in the ordinary-temperature range. When the deterioration of the Vt level in the low-temperature range is hypothetically smaller by "1" than the deterioration of the Vt level in the ordinary-temperature range, the trimming data memorized in the memory cell array 120 is corrected so as to decrease by −1 in the data corrector 210. Accordingly, the Vt level is reset based on the trimming data decreased by −1 in the low-temperature range where the deterioration is smaller by "1". As a result, in the case where the ambient temperature when the test process is performed is in the low-temperature range, the Vt level prior to the deterioration can be accurately restored in a manner similar to the case of the ordinarily-temperature range.

The high-temperature range, ordinary-temperature range and low-temperature range are only examples as the temperature range set as the ambient temperature in the test process, which is not necessarily limited to these three temperature ranges. The manufacturing process and the test process are also mentioned as an example, the present invention is not necessarily limited to these processes.

As described above, when the Vt level of the reference cell 100 is reset, the standard current is adjusted based on the corrected trimming data, and the Vt level of the reference cell 100 is reset to the predetermined level.

The trimming data correction in the data corrector 210 based on the designated temperature inputted from the temperature designator 220 can be realized by means of either of a circuit or a software computation. For example, an adder and a subtracter are used as circuits for executing addition and subtraction of +1 in the high-temperature range and −1 in the low-temperature range, with respect to the trimming data in the ordinary-temperature range. More specifically, the trimming data in the ordinary-temperature range "0010" is corrected to "0011" in the high-temperature range and "0001" in the low-temperature range. In the case of a software processing is employed, these operations are executed by means of, for example, software such as microcode.

In the semiconductor memory device thus constituted, an effect similar to that of the preferred embodiment 1 can be obtained. Further, by constituting the semiconductor memory device so as to further comprise the data corrector 210 for correcting the trimming data in accordance with the temperature characteristics of the standard and reference currents, the trimming processing can be accurately executed even in the case where the ambient temperature is different between when the trimming data is calculated and when the reference cell is reset. Therefore, an effect equal to that in the case without change of the temperature can also be obtained even under the various temperature conditions in between the test processes and actual usage.

Preferred Embodiment 3

FIG. 3 is a block diagram of a semiconductor memory device according to a preferred embodiment 3 of the present invention. Any like component is provided with the same reference numeral as shown in FIGS. 1 and 2 and is not described again. In FIG. 3, 310 denotes a non-volatile memory cell array for memorizing a plurality of digital values as the trimming data.

An operation of the semiconductor memory device according to the preferred embodiment 3 thus constituted is described below. The operation according to the preferred embodiment 3 is basically similar to that of the preferred embodiment 2. The preferred embodiment 3 is different from the preferred embodiment 2 in the point that a plurality of trimming data for temperature correction is memorized in the memory cell array 310. The plurality of trimming data for temperature correction means the following data. For example, it is the following data in the case where the test is performed at a plurality of ambient temperatures such as the high-temperature range, ordinary-temperature range and low-temperature range in the test process with respect to the trimming data memorized in the memory cell array 120 in the manufacturing process in the ordinary-temperature range as described in the preferred embodiment 2.

data corrected in the data corrector 210 for the high-temperature range data corrected in the data corrector 210 for the ordinary-temperature range (correction is unnecessary in the present case)

data corrected in the data corrector 210 for the low-temperature range

These corrected data are memorized in different regions of the memory cell array 310.

When the Vt level of the reference cell 100 is reset, the standard current is adjusted based on optimum data of the plurality of corrected trimming data corresponding to the current ambient temperature (for example, when the test process is performed), and the Vt level of the reference cell 100 is reset to the predetermined level.

The optimum data denotes the data corresponding to the ambient temperature designated by the temperature designator 220 among the data corrected for the high-temperature range, data corrected for the ordinary-temperature range and data corrected for the low-temperature range which are memorized in the memory cell array 310, and the relevant corrected data is selected. The correction of the trimming data based on the designated temperature can be realized by means of the circuit or software operation in a manner similar to the preferred embodiment 2. The semiconductor memory device thus constituted can also achieve an effect similar to that of the preferred embodiment 2.

Preferred Embodiment 4

FIG. 4 is a block diagram of a semiconductor memory device according to a preferred embodiment 4 of the present invention. Any like component is provided with the same reference numeral as shown in FIG. 1 and is not described again. In FIG. 4, 410 denotes a data corrector provided in the memory core 10 for correcting the trimming data based on the current ambient temperature (when the test process is performed). 420 denotes a temperature detector provided in the memory core 10.

An operation of the semiconductor memory device according to the preferred embodiment 4 thus constituted is described below. The operation according to the preferred embodiment 4 is basically similar to that of the preferred embodiment 1. The preferred embodiment 4 is different from the preferred embodiment 1 in the point that the trimming data retrieved from the memory cell array 120 is corrected in the data corrector 410 based on the current ambient temperature detected by the temperature detector 420. More specifically, as shown in the preferred embodiment 2, for example, when the test is performed at a plurality of temperature ranges such as the high-temperature range, ordinary-temperature range and low-temperature range in the test process with respect to the trimming data that is memorized in the memory cell array 120 in the manufacturing process in the ordinary-temperature range, the current ambient temperature in the test process is detected in the temperature detector 420. Then, the data is corrected (addition) in response to the high-temperature range when a result of the detection shows the high-temperature range, the data is used without any correction when the detection result shows the ordinary-temperature range, and the data is corrected (subtraction) in response to the low-temperature range when the detection result shows the low-temperature range.

When the Vt level of the reference cell 100 is reset, the standard current is adjusted based on the corrected trimming data, and the Vt level of the reference cell 100 is reset to the predetermined level. The correction of the trimming data based on the detected temperature can be realized by means of the circuit or software operation in a manner similar to the preferred embodiment 2. The semiconductor memory device thus constituted can also achieve an effect similar to that of the preferred embodiment 2.

Preferred Embodiment 5

FIG. 5 is a block diagram of a semiconductor memory device according to a preferred embodiment 5 of the present invention. In FIG. 5, 500 denotes an oscillator. 510 denote a counter for counting a clock number of the oscillator 500 during an arbitrary period inputted from outside. 520 denotes a clock number comparator for obtaining a difference between the clock number outputted from the counter 510 and the clock number inputted from outside. 530 denotes a non-volatile memory cell array for memorizing a result of the comparison by the clock number comparator 520 as the trimming data. 540 denotes a frequency adjuster for adjusting a clock frequency generated by the oscillator 500 in accordance with the trimming data value. 550 denotes a peripheral circuit. These constituent elements 500-550 are provided in a memory core 30 that is a chip. 560 denotes a sampling time designator provided in an external device 40. 570 denotes a target count value designator provided in the external device 40.

A switch 581 switches over to transmit the comparison result of the clock number comparator 520 to the memory cell array 530 or a switch 582. The switch 582 switches over the comparison result of the clock number comparator 520 to the trimming data from the memory cell array 530 so as to transmit the switchover data to the frequency adjuster 540. Accordingly, when the comparison result of the clock number comparator 520 is used in real time, the data is transmitted to the clock number comparator 520, switch 581, switch 582 and frequency adjuster 540 in the order. Further, when the comparison result of the clock number comparator 520 is temporarily memorized in the memory cell array 530 and thereafter reused after a power supply is turned off, the data is transmitted to the clock number comparator 520, switch 581, memory cell array 530, switch 582 and frequency adjuster 540 in the order.

An operation of the semiconductor memory device according to the preferred embodiment 5 thus constituted is described below. First, during a sampling period inputted from the sampling time designator 560 in the external device 40, the clock number of the oscillator 500 is counted with the counter 510. The sampling time in the counter 510 is arbitrary, and the clock number can be more accurately counted as the sampling time is extended, meanwhile the counting time can be reduced when the sampling period is shortened.

Next, the clock number which is the count value inputted from the target count value designator 570 in the external device 40 and the clock number which is the counting result of the counter 510 are compared to each other in the clock number comparator 520 so that a difference between them is calculated, and the comparison result (difference) is memorized as the trimming data in the memory cell array 530. The count value inputted from the target count value designator 570 is an original number of oscillations by the oscillator 500 during the sampling time inputted from the sampling time designator 560. More specifically, the difference between the clock number outputted by the counter 510 and the clock number inputted from the target count value designator 570 is calculated so that it is judged if the clock frequency generated by the oscillator 500 is adjusted as expected. For example, assuming that the clock number inputted from the target count value designator 570 is "5", it is judged that the clock frequency generated by the oscillator 500 has not reached the expected value when the clock number outputted from the counter 510 is "4". As a result, the trimming data that is the data corrected by +1 is calculated. When the clock number outputted from the counter 510 is "6", it is judged that the clock frequency generated by the oscillator 500 exceeds the expected value, the trimming data which is the data corrected by −1 is calculated.

Thereafter, the clock frequency generated by the oscillator 500 is adjusted by the frequency adjuster 540 based on the trimming data stored in the memory cell array 530 (not via the memory cell array 530 when used in real time), and the adjusted clock frequency is used as a drive frequency so that the peripheral circuit 570 is operated.

According to the semiconductor memory device thus constituted, the trimming data can be calculated inside the chip and memorized in the memory cell array 530, and thereafter, the clock frequency constantly generated by the oscillator 500 can be kept at a certain value based on the trimming data memorized in the memory cell array 530. Further, the amount of time for counting the clock number and the trimming resolving power can be selected in accordance with the required frequency trimming accuracy.

Further, as processing for measurement, calculation and programming in the non-volatile memory on the random trimming data specific to each chip can be carried out inside the chip, it becomes unnecessary to individually control each chip even when a plurality of chips is simultaneously measured by the external device 40. Therefore, the test costs including the testing time, the number of development steps on the test program and the like can be reduced, and any human error can be thereby reduced even in the state where the test program is complicated. Further, the amount of time required for the correction and the resolving power can be flexibly selected. As a result, the trimming processing can be achieved with an improved accuracy while the trimming inside the chip is realized at the same time.

Preferred Embodiment 6

FIG. 6 is a block diagram of a semiconductor memory device according to a preferred embodiment 6 of the present invention. Any like component is provided with the same reference numeral as shown in FIG. 5 and is not described again. In FIG. 6, 610 denotes a data corrector provided in the memory core 30 for correcting the trimming data based on the designated temperature inputted from outside. 620 denotes a temperature designator provided in the external device 40 at the time when an operation of the oscillator 500 is used. An operation of the semiconductor memory device according to the preferred embodiment 6 thus constituted is described below.

The operation according to the preferred embodiment 6 is basically similar that of the preferred embodiment 5. The preferred embodiment 6 is different from the preferred embodiment 5 in the point that the difference between the clock number outputted from the counter 510 and the clock number inputted from the target count value designator 570 is calculated in the clock number comparator 520, and thereafter, the trimming data is corrected by the data corrector 610 in accordance with the designated temperature inputted from the temperature designator 620.

The designated temperature inputted from the temperature designator 620 and the correction implemented by the data corrector 610 based on the designated temperature are similar to the designated temperature inputted from the temperature designator 220 and the correction implemented by the data corrector 210 based on the designated temperature shown in the preferred embodiment 2. When the oscillator 500 is used, the clock frequency generated by the oscillator 500 is adjusted based on the corrected trimming data, and the adjusted clock frequency is used as the drive frequency so that the peripheral circuit 550 is operated. The correction of the trimming data based on the designated temperature can be realized by means of the circuit or software operation in a manner similar to the preferred embodiment 2.

According to the semiconductor memory device thus constituted, an effect similar to that of the preferred embodiment 5 can be obtained. Further, by constituting the semiconductor memory device so as to further comprise the data corrector 610 for correcting the trimming data in accordance with the temperature characteristic of the oscillator 500, the accurate trimming processing can be executed even in the case where the temperature is different between when the trimming data is calculated and when the oscillator is used. Therefore, an effect equal to the case without change of the temperature can also be obtained under the various temperature conditions between the test processes and in actual usage.

Preferred Embodiment 7

Figure 7:
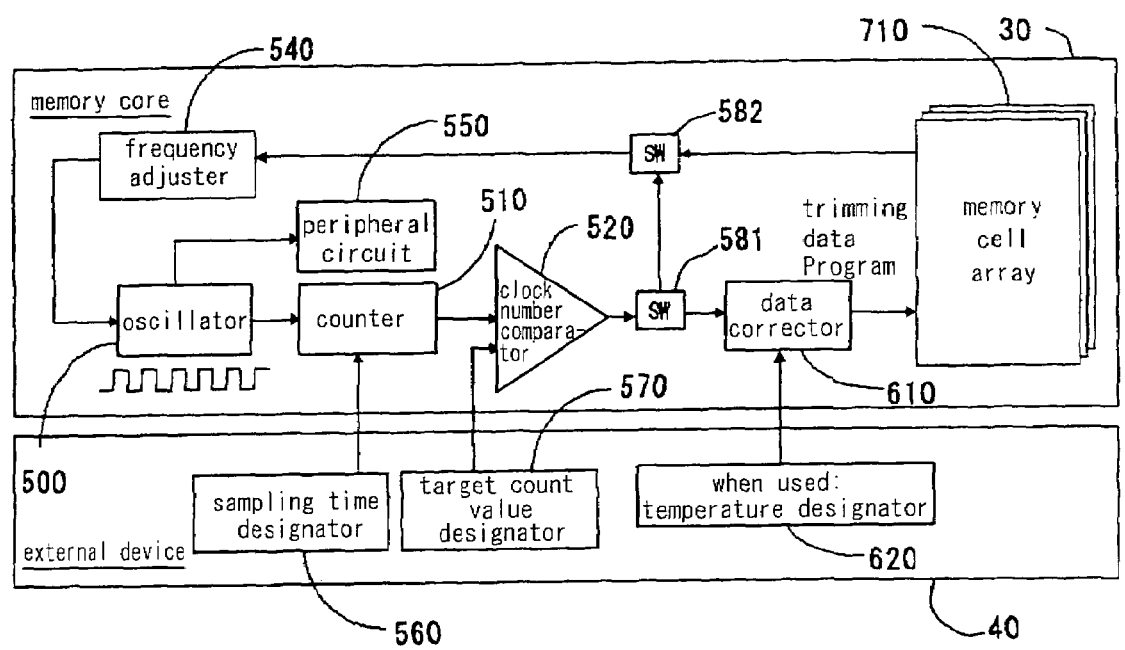
FIG. 7 is a block diagram of a semiconductor memory device according to a preferred embodiment 7 of the present invention.

FIG. 7 is a block diagram of a semiconductor memory device according to a preferred embodiment 7 of the present invention. Any like component is provided with the same reference numeral as shown in FIGS. 5 and 6 and is not described again. In FIG. 7, 710 denotes a non-volatile memory cell array for memorizing a plurality of digital values as the trimming data.

An operation of the semiconductor memory device according to the preferred embodiment 7 thus constituted is described below. The operation according to the preferred embodiment 7 is basically similar to that of the preferred embodiment 6. The preferred embodiment 7 is different from the preferred embodiment 6 in the point that a plurality of trimming data for temperature correction is memorized in the memory cell array 710. The memory cell array 710 for memorizing the plurality of trimming data for temperature correction is similar to the memory cell array 310 according to the preferred embodiment 3. The trimming data includes, for example, the data corrected for the high-temperature range, data corrected for the ordinary-temperature range and data corrected for the low-temperature range, and the foregoing data is memorized in different regions of the memory cell array 710.

When the oscillator 500 is used, the clock frequency is adjusted based on the data considered optimum among the plurality of corrected trimming data so that the peripheral circuit 550 is operated. The optimum data denotes the data corresponding to the ambient temperature designated by the temperature designator 620 among the data corrected for the high-temperature range, data corrected for the ordinary-temperature range and data corrected for the low-temperature range which are memorized in the memory cell array 710 as described in the preferred embodiment 3.

The trimming data correction based on the designated temperature can be realized by means of the circuit or software operation in a manner similar to the preferred embodiment 2. The semiconductor memory device thus constituted can also obtain an effect similar to that of the preferred embodiment 6 can be obtained.

Preferred Embodiment 8

FIG. 8 is a block diagram of a semiconductor memory device according to a preferred embodiment 8 of the present invention. Any like component is provided with the same reference numeral as shown in FIG. 5 is not described again. In FIG. 8, 810 denotes a temperature detector provided in the memory core 30, and 820 denotes a data corrector provided in the memory core 30 for correcting the trimming data based on the current ambient temperature (when the test process is performed).

An operation of the semiconductor memory device according to the preferred embodiment 8 thus constituted is described below. The operation according to the preferred embodiment 8 is basically similar to that of the preferred embodiment 5. The preferred embodiment 8 is different from the preferred embodiment 5 in the point that the trimming data retrieved from the memory cell array 530 is corrected in the data corrector 820 based on the current (when the test process is performed) ambient temperature specified by the temperature detector 810. More specifically, as described in the preferred embodiment 4, for example, the trimming data memorized in the memory cell array 530 when the trimming data in the normal-temperature range is calculated is used in such a plurality of temperature ranges as the high-temperature range, ordinary-temperature range and low-temperature range when the oscillator is used. In such a case, the current temperature is detected through the temperature detector 810, and the data correction suitable for the high-temperature range (addition) is executed to the trimming data when the detected ambient temperature is in the high-temperature range. When the detected ambient temperature is in the normal-temperature range, the trimming data is directly used without any correction. When the detected ambient temperature is in the low-temperature range, the data correction suitable for the low-temperature range (subtraction) is executed to the trimming data.

When the oscillator 500 is used, the clock frequency is adjusted based on the corrected trimming data, and the peripheral circuit 550 is thereby operated. The trimming data correction based on the designated temperature can be realized by means of the circuit or software operation in a manner similar to the preferred embodiment 2. In the semiconductor memory device thus constituted, an effect similar to that of the preferred embodiment 6 can also be obtained.

Preferred Embodiment 9

Figure 9:
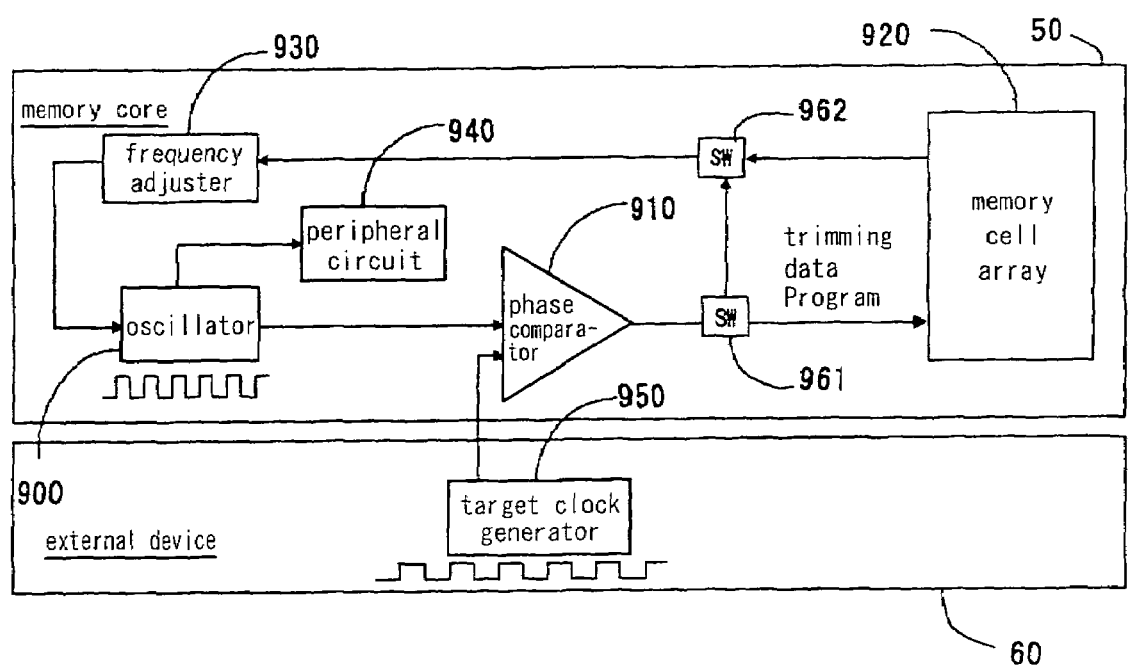
FIG. 9 is a block diagram of a semiconductor memory device according to a preferred embodiment 9 of the present invention.

FIG. 9 is a block diagram of a semiconductor memory device according to a preferred embodiment 9 of the present invention. In FIG. 9, a reference numeral 900 denotes an oscillator. 910 denotes a phase comparator for comparing a phase of a clock outputted from the oscillator 900 to a phase of a clock inputted from outside. 920 denotes a non-volatile memory cell array for memorizing a result of the comparison by the phase comparator 910 as the trimming data. 930 denotes a frequency adjuster for adjusting a clock frequency generated by the oscillator 900 in accordance with the trimming data value. 940 denotes a peripheral circuit. These constituent elements 900-940 are provided in a memory core 50 that is a chip. 950 denotes a target clock generator provided in an external device 60.

A switch 961 performs switchover to transmit the comparison result of the phase comparator 910 to the memory cell array 920 or a switch 962. The switch 962 switches over one of the comparison result of the phase comparator 910 to the trimming data from the memory cell array 920 so as to transmit the switchover data to the frequency adjuster 930. According to the functions of these switches, when the comparison result of the phase comparator 910 is used in real time, the data is transmitted to the phase comparator 910, switch 961, switch 962 and frequency adjuster 930 in the order. In the case where the comparison result of the phase comparator 910 is temporarily memorized in the memory cell array 920 and reused after the power supply is turned off, the data is transmitted to the phase comparator 910, switch 961, memory cell array 920, switch 962 and frequency adjuster 930 in the order.

An operation of the semiconductor memory device according to the preferred embodiment 9 thus constituted is described below. The operation according to the preferred embodiment 9 is basically similar that of the preferred embodiment 5. The preferred embodiment 9 is different from the preferred embodiment 5 in the point that the trimming data is calculated based on the comparison of the phase of the clock from the oscillator 900 to the clock inputted from the target clock generator 950 in the external device. The clock inputted from the target clock generator 950 corresponds to an original clock number of the oscillator 900. More specifically, a difference between the clock number outputted by the oscillator 900 and the clock number inputted from the target clock generator 950 is obtained so that it is judged whether or not the clock frequency generated by the oscillator 900 is adjusted as expected. Assuming that the clock number inputted from the target clock generator 950 is "5", for example, it is judged that the clock frequency has not reached the expected value yet when the clock number outputted from the oscillator 900 is "4", and the trimming data increased by +1 is calculated. Meanwhile, when the clock number outputted by the oscillator 900 is "6", it is judged that the clock frequency has already reached the expected value, and the trimming data decreased by −1 is calculated.

Thereafter, based on the trimming data stored in the memory cell array 920 (not via the memory cell array 920 when used in real time), the frequency adjuster 930 adjusts the clock frequency generated by the oscillator 900, and the peripheral circuit 940 is operated based on the adjusted clock frequency used as the drive frequency.

According to the semiconductor memory device thus constituted, the trimming data can be calculated at a high speed inside the chip and memorized in the memory cell array 920, and thereafter, the clock frequency constantly generated by the oscillator 900 can be kept at a certain value based on the trimming data memorized in the memory cell array 920.

Further, as the processing of measurement, calculation and programming in the non-volatile memory can be carried out inside the chip with respect to the random trimming data that is specific to each chip, it is unnecessary for each chip to be individually controlled even when more than one chip is simultaneously measured by the external device 60. As a result, the test costs including the testing time, number of development steps on the test program and the like can be cut down, and any human error involving the complication of the test program can be reduced.

Further, even in the case where a high frequency and a high accuracy are demanded in the trimming processing, the trimming data can be more speedily calculated. As a result, the operation can be accelerated, and the testing time can be reduced.

Preferred Embodiment 10

FIG. 10 is a block diagram of a semiconductor memory device according to a preferred embodiment 10 of the present invention. Any like component is provided with the same reference numeral as shown in FIG. 9 is not described again. In FIG. 10, 1010 denotes a data corrector provided in the memory core 50 and correcting the trimming data based on the designated temperature inputted from outside. 1020 denotes a temperature designator at usage of the oscillator provided in the external device 60 and.

An operation of the semiconductor memory device according to the preferred embodiment 10 thus constituted is described below. The operation according to the preferred embodiment 10 is basically similar that of the preferred embodiment 9. The preferred embodiment 10 is different from the preferred embodiment 9 in the point that the phase of the clock from the oscillator 900 is compared to the phase of the clock inputted from outside in the phase comparator 910, and thereafter, the trimming data is corrected in the data corrector 1010 in accordance with the designated temperature inputted from the temperature designator 1020.

The designated temperature inputted from the temperature designator 1020 and the correction implemented by the data corrector 1010 based on the designated temperature are similar to the designated temperature inputted from the temperature designator 220 and the correction implemented by the data corrector 210 based on the designated temperature described in the preferred embodiment 2.

When the oscillator 900 is used, the clock frequency is adjusted based on the corrected trimming data, and the adjusted clock frequency is used as the drive frequency so that the peripheral circuit 940 is operated. The trimming data correction based on the designated temperature can be realized by means of the circuit or software operation in a manner similar to the preferred embodiment 2. According to the semiconductor memory device thus constituted, an effect similar to that of the preferred embodiment 9 can be obtained. Further, by constituting the semiconductor memory device so as to further comprise the data corrector 1010 for correcting the trimming data in accordance with the temperature characteristic of the oscillator 900, the accurate trimming processing can be executed even in the case where the ambient temperature is different between when the trimming data is calculated and when the oscillator is used. Therefore, an effect equal to the case without change of the temperature can be obtained under the various temperature conditions between the test processes and in actual usage.

Preferred Embodiment 11

Figure 11:
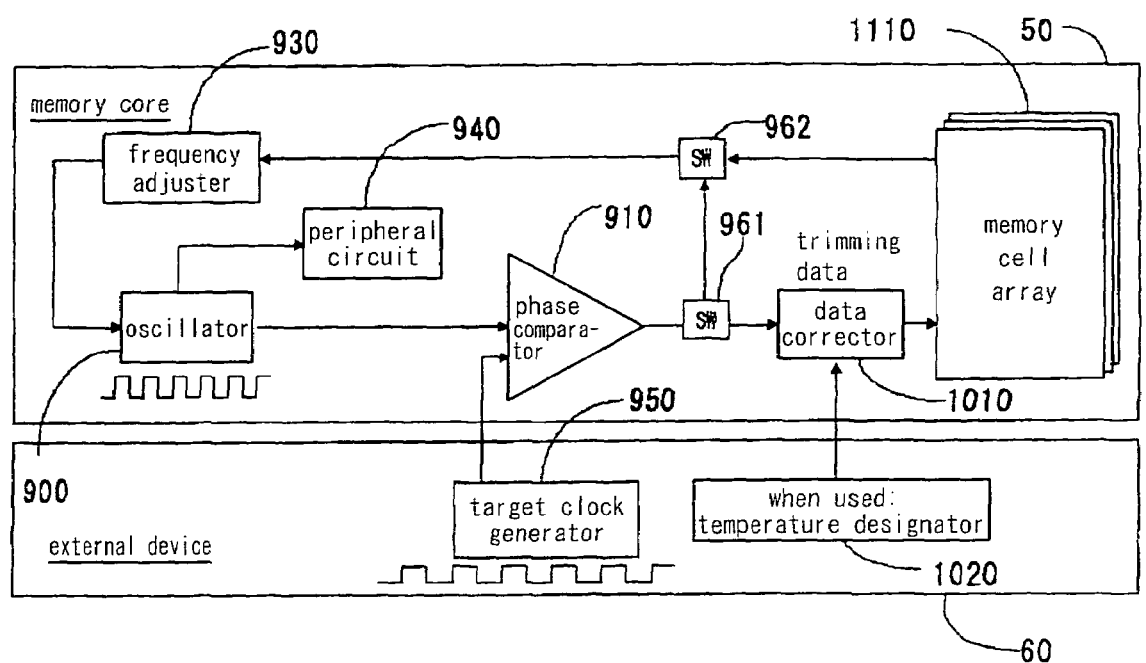
FIG. 11 is a block diagram of a semiconductor memory device according to a preferred embodiment 11 of the present invention.

FIG. 11 is a block diagram of a semiconductor memory device according to a preferred embodiment 11 of the present invention. Any like component is provided with the same reference numeral as shown in FIGS. 9 and 10 and is not described again. In FIG. 11, 1110 denotes a non-volatile memory cell array for memorizing a plurality of digital values as the trimming data.

An operation of the semiconductor memory device according to the preferred embodiment 11 thus constituted is described below. The operation according to the preferred embodiment 11 is basically similar to that of the preferred embodiment 10. The preferred embodiment 11 is different from the preferred embodiment 10 in the point that a plurality of trimming data for temperature correction is memorized in the memory cell array 1110. The memory cell array 1110 for memorizing the plurality of trimming data for temperature correction is similar to the memory cell array 310 according to the preferred embodiment 3. The plurality of trimming data for the temperature correction includes, for example, the data corrected for the high-temperature range, data corrected for the ordinary-temperature range and data corrected for the low-temperature range, and the foregoing data is memorized in different regions of the memory cell array 1110.

When the oscillator 900 is used, the clock frequency is adjusted based on the data considered optimum among the plurality of corrected trimming data so that the peripheral circuit 940 is operated based on the adjusted clock frequency used as the drive frequency. As described in the preferred embodiment 3, the optimum data denotes the trimming data corresponding to the ambient temperature designated by the temperature designator 1020 among the trimming data corrected for the high-temperature range, trimming data corrected for the ordinary-temperature range and trimming data corrected for the low-temperature range which are memorized in the memory cell array 1110.

The trimming data correction based on the designated temperature can be realized by means of the circuit or software operation in a manner similar to the preferred embodiment 2. The semiconductor memory device thus constituted can also obtain an effect similar to that of the preferred embodiment 10 can be obtained.

Preferred Embodiment 12

FIG. 12 is a block diagram of a semiconductor memory device according to a preferred embodiment 12 of the present invention. Any like component is provided with the same reference numeral as shown in FIG. 9 and it is not described again. In FIG. 12, 1210 denotes a temperature detector provided in the memory core 50, and 1220 denotes a data corrector provided in the memory core 50 for correcting the trimming data based on the current ambient temperature.

An operation of the semiconductor memory device according to the preferred embodiment 12 thus constituted is described below. The operation according to the preferred embodiment 12 is basically similar to that of the preferred embodiment 9. The preferred embodiment 12 is different from the preferred embodiment 9 in the point that the trimming data retrieved from the memory cell array 920 is corrected in the data corrector 1210 based on the current ambient temperature detected by the temperature detector 1210. More specifically, as described in the preferred embodiment 4, for example, in the case where the trimming data memorized in the memory cell array 530 at the time of calculating the trimming data in the normal-temperature range, is used in such a plurality of temperature ranges as the high-temperature range, ordinary-temperature range and low-temperature range when the oscillator is used, the current ambient temperature is detected by the temperature detector 1210, and the data correction suitable for the high-temperature range (addition) is executed to the trimming data when the detected ambient temperature is in the high-temperature range. When the detected ambient temperature is in the normal-temperature range, the trimming data is directly used without any correction. When the detected ambient temperature is in the high-temperature range, the data correction suitable for the low-temperature range (subtraction) is executed to the trimming data.

When the oscillator 900 is used, the clock frequency generated by the oscillator 900 is adjusted based on the corrected trimming data, and the peripheral circuit 940 is operated based on the clock frequency used as the drive frequency. The trimming data correction based on the detected temperature can be realized by means of the circuit or software operation in a manner similar to the preferred embodiment 2. In the semiconductor memory device thus constituted, an effect similar to that of the preferred embodiment 10 can be obtained.

Though there the preferred embodiments of this invention has been described in detail, it will be understood that various modifications may be made therein, and it is intended to cover in the appended claims all such modifications as fall within the true spirit and scope of this invention.

What is claimed is:

1. A semiconductor memory device comprising:
   a memory cell;
   a reference cell for outputting a reference current of a data reading current of the memory cell;
   a non-volatile memory cell for memorizing a trimming data in accordance with the reference current;
   a standard current generator for outputting a standard current in a state where a current quantity is adjusted in accordance with the trimming data;
   a current comparator for comparing the standard current to the reference current; and
   a reference cell adjuster for adjusting an output of the reference current from the reference cell based on a result of the comparison by the current comparator.

2. The semiconductor memory device as claimed in claim 1, wherein the reference cell adjuster adjusts an output of the reference current by rewriting a threshold voltage of the reference cell.

3. The semiconductor memory device as claimed in claim 1, wherein the reference cell has a structure equal to the memory cell to output the reference current.

4. The semiconductor memory device as claimed in claim 1, further comprising an AD converter for converting the reference current into a digital value, wherein the non-volatile memory cell memorizes the digital value as the trimming data.

5. The semiconductor memory device as claimed in claim 1, further comprising an adjustment necessary/unnecessary judger for judging whether or not adjustment of the reference cell is necessary based on a result of the comparison by the current comparator, wherein the reference cell adjuster adjusts the reference cell based on a result of judgment of the adjustment necessary/unnecessary judger.

6. The semiconductor memory device as claimed in claim 1, wherein the reference cell adjuster adjusts the reference cell based on a result of the comparison by the current comparator or an external input signal.

7. The semiconductor memory device as claimed in claim 1, further comprising a data corrector for correcting the trimming data in accordance with temperature characteristics of the standard current and the reference current.

8. The semiconductor memory device as claimed in claim 7, wherein the data corrector corrects the trimming data in accordance with temperature characteristics of a plurality of temperature ranges of the standard current and the reference current.

9. The semiconductor memory device as claimed in claim 1, further comprising:
   a temperature detector for detecting an ambient temperature of the semiconductor memory device, and
   a data corrector for correcting a trimming data retrieved from the non-volatile memory cell in accordance with a result of detection in the temperature detector.

* * * * *